United States Patent [19]

Dumoulin et al.

[11] Patent Number: 5,671,742

[45] Date of Patent: Sep. 30, 1997

[54] METHOD FOR MAGNETIC RESONANCE ANGIOGRAPHY USING IN-FLOW OF TRANSVERSE SPIN MAGNETIZATION

[75] Inventors: Charles Lucian Dumoulin, Ballston Lake; Erika Schneider, Rexford, both of N.Y.

[73] Assignee: General Electric Company, Schenectady, N.Y.

[21] Appl. No.: 772,648

[22] Filed: Dec. 23, 1996

Related U.S. Application Data

[63] Continuation of Ser. No. 578,791, Dec. 26, 1995, abandoned.

[51] Int. Cl.⁶ ............................................. A61B 5/05
[52] U.S. Cl. ......................... 128/653.3; 128/653.2; 324/307; 324/309
[58] Field of Search ............... 128/653.2, 653.3; 324/307, 309

[56] References Cited

U.S. PATENT DOCUMENTS 5,285,158  2/1994  Mistretta et al. ............... 324/309
5,375,598  12/1994  Dumoulin et al. ............... 128/653.3
5,446,384  8/1995  Dumoulin ........................ 324/307

Primary Examiner—Marvin M. Lateef
Assistant Examiner—Eleni Mantis Mercader
Attorney, Agent, or Firm—Lawrence P. Zale; Marvin Snyder

[57] ABSTRACT

Radiofrequency (RF) and magnetic field gradient pulse sequences employ Time-of-Flight (TOF) strategy to selectively create transverse spin magnetization which is then maintained for a selected period of time and then imaged in order to generate a vessel selective magnetic resonance angiogram. The pulse sequence employs a spatially selective excitation pulse which is used to create transverse spin magnetization in a selected region of a subject. This region typically is made to include the root of the vessel to be imaged. After excitation, transverse magnetization is maintained with a series of refocusing RF pulses while the blood moves along the vessel. The transverse magnetization is then sampled at one or more selected times after excitation with conventional imaging strategies.

13 Claims, 6 Drawing Sheets ific physical phenomena and each class has certain
METHOD FOR MAGNETIC RESONANCE ANGIOGRAPHY USING IN-FLOW OF TRANSVERSE SPIN MAGNETIZATION This application is a Continuation of application Ser. No. 08/578,791 filed Dec. 26, 1995 and now abandoned.

BACKGROUND OF THE INVENTION

1. Field of the Invention

This invention relates to magnetic resonance (MR) imaging and more specifically to the creation of magnetic resonance angiograms from a patient.

2. Description of Related Art

Several methods for the detection of magnetic resonance angiograms are currently in use. Most of these methods can be classified as either a "time-of-flight" method or as a "phase-sensitive" method. Each class of methods relies on a specific physical phenomena and each class has certain limitations.

Time-of-flight methods rely on the in-flow of longitudinal pin magnetization into the imaged region. Typically, time-of-flight angiography is performed with the repeated application of radiofrequency (RF) pulses which serve to both create transverse spin magnetization for imaging and to reduce longitudinal magnetization within the imaged region. Blood which is outside the imaged volume, however, does not experience the application of the RF pulses and consequently, has fully relaxed longitudinal spin magnetization. As the relaxed blood flows into the imaged volume, it appears much brighter than its surroundings because the fully relaxed longitudinal spin magnetization provides a stronger magnetic resonance signal than that of stationary tissue.

Unfortunately, time-of-flight angiograms do not provide total suppression of stationary tissue within the imaged volume since total suppression of the stationary tissue would also suppress the signal from moving blood. Time-of-flight angiograms are also of limited use in regions of the body having tissues with a short longitudinal relaxation time since rapidly relaxing tissue has a magnetic resonance signal intensity which can be as strong as in-flowing blood.

The second class of magnetic resonance angiography methods relies on the creation of phase shifts in transverse spin magnetization which are proportional to velocity. These phase shifts are induced by applying a flow-encoding magnetic field gradient pulse after transverse magnetization is created by an RF excitation pulse. Unlike time-of-flight methods, phase-sensitive methods can provide total suppression of stationary tissues and do not detect signals from tissue having a short longitudinal relaxation time. Unfortunately, in many clinical applications, moving blood in both desired and undesired vessels are present in the region of interest and phase-sensitive methods are not capable of distinguishing moving blood in a desired vessel to be imaged from undesired moving blood or tissue.

Presently, there is a need for magnetic resonance angiography methods which provide complete suppression of surrounding tissue and discriminate blood flowing in selected blood vessels from undesired magnetic resonance signals arising from moving structures within the body.

SUMMARY OF THE INVENTION

Pulse sequences for the selective detection of blood within arteries and veins are disclosed. The pulse sequences employ a Time-of-Flight (TOF) strategy, but are unlike previously disclosed TOF methods in that transverse spin magnetization rather than longitudinal spin magnetization is followed. The pulse sequences employ a spatially selective excitation pulse which is used to create transverse spin magnetization in a selected region of a subject. This region typically is made to include the root of the vessel to be imaged. After excitation, transverse magnetization is maintained with a series of refocusing RF pulses while the blood moves along the vessel. The transverse magnetization is then sampled at one or more selected times after excitation with conventional imaging strategies.

OBJECTS OF THE INVENTION

It is an object of the present invention to provide a method for the creation of magnetic resonance angiograms which provide a high degree of background suppression and are insensitive to moving blood outside the vessels of interest within a subject.

BRIEF DESCRIPTION OF THE DRAWINGS

The features of the invention believed to be novel are set forth with particularity in the appended claims. The invention itself, however, both as to organization and method of operation, together with further objects and advantages thereof, may best be understood by reference to the following description taken in conjunction with the accompanying drawing in which:

DETAILED DESCRIPTION OF THE INVENTION

Figure 1:
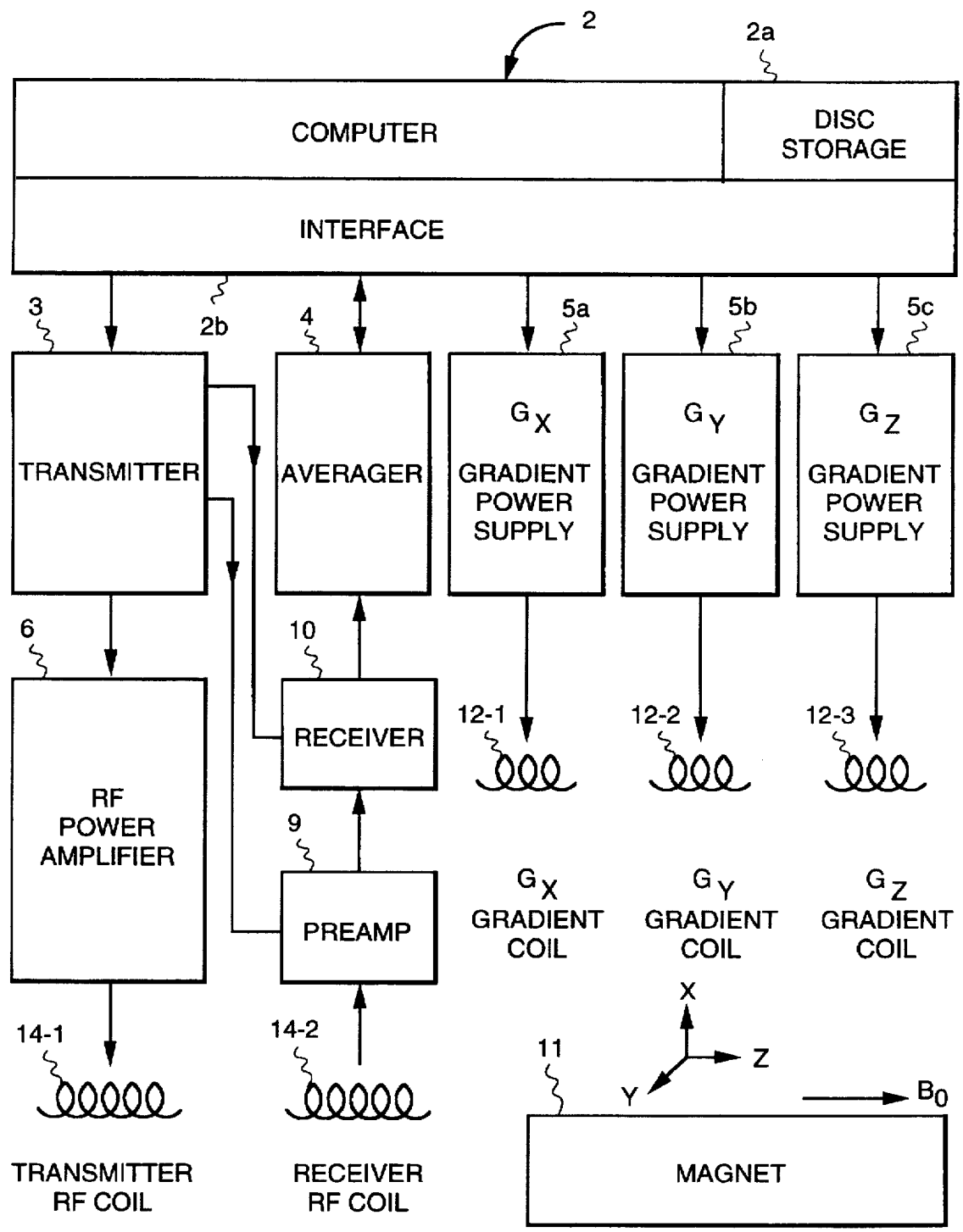
FIG. 1 is a simplified block diagram of the major components of a magnetic resonance (MR) imaging system suitable for use with the present invention.

FIG. 1 is a simplified block diagram of the major components of a magnetic resonance (MR) imaging system suitable for use with the invention described herein. The system is made up of a general purpose mini-computer 2 which is functionally coupled to a disk storage unit 2a and an interface unit 2b. A radiofrequency (RF) transmitter 3, signal averager 4, and gradient power supplies 5a, 5b and 5c, are all coupled to computer 2 through interface unit 2b. Gradient power supplies 5a, 5b, 5c energize gradient coils 12-1, 12-2, 12-3 to create magnetic field gradients $G_x$, $G_y$, $G_z$, respectively, in the "X", "Y", "Z" directions, respectively, over a subject desired to be imaged. RF transmitter 3 is gated with pulse envelopes from computer 2 to generate RF pulses having the required modulation to excite an MR response signal from the subject. The RF pulses are amplified in an RF power amplifier 6 to levels varying from 2 Watts (W) to several kilowatts (kW), depending on the imaging method, and applied RF transmit coil 14-1. The higher power levels are necessary for large sample volumes, such as in whole body imaging, and where short duration pulses are required to excite large MR frequency bandwidths in larger RF coils.

MR response signals are sensed by a receiver coil 14-2, amplified in a low noise preamplifier 9 and passed to receiver 10 for further amplification, detection, and filtering. The signal is then digitized for averaging by signal averager 4 and for processing by computer 2. Preamplifier 9 and receiver 10 are protected from the RF pulses during transmission by active gating or by passive filtering.

Computer 2 provides gating and envelope modulation for the MR pulses, blanking for the preamplifier and RF power amplifier, and voltage waveforms for the gradient power supplies. The computer also performs data processing such as Fourier transformation, image reconstruction, data filtering, imaging display, and storage functions (all of which are conventional and outside the scope of the present invention).

RF transmitter coil 14-1 and receiver coil 14-2, if desired, may comprise a single coil. Alternatively, two separate coils that are electrically orthogonal may be used. The latter configuration has the advantage of reduced RF pulse breakthrough into the receiver during pulse transmission. In both cases, the magnetic field associated with the coils are orthogonal to the direction of a static magnetic field $B_0$ produced by a magnet means 11. The coils may be isolated from the remainder of the system by enclosure in an RF shielded cage.

In the present embodiment of the invention, the subject is placed within the magnet of a magnetic resonance (MR) imaging system. The region over which the acquisition of angiographic images is desired is then identified by an operator, perhaps with the assistance of a conventional MR imaging sequence. A pulse sequence is then applied and the data reconstructed.

Figure 2:
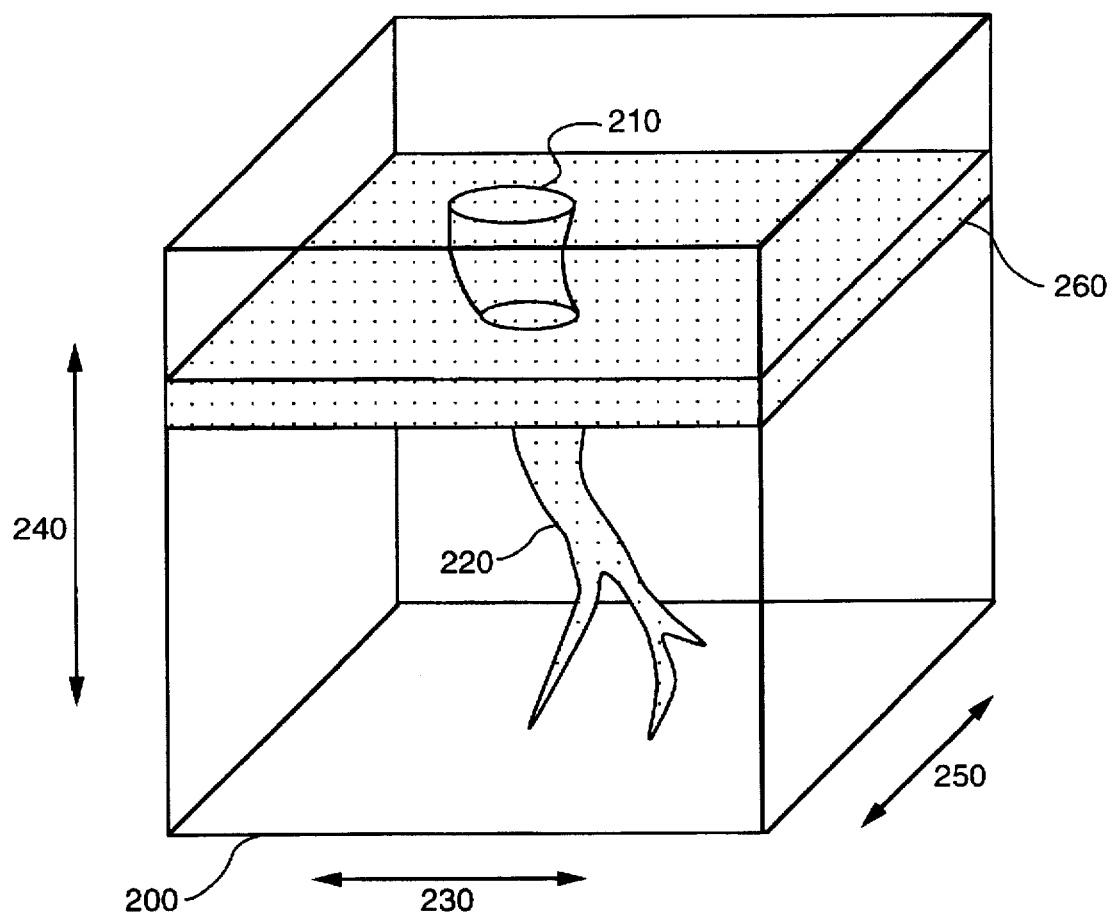
FIG. 2 is a diagram of a blood vessel in an imaged volume showing the relative orientation of selected directions according to the present invention.

FIG. 2 is a diagram illustrating an image volume 200 which contains a blood vessel 210 to be imaged with the present invention. Blood vessel 210 is intersected with an excitation volume 260. Blood which is subjected to excitation pulses flows downstream and fills a distal portion 220 of blood vessel 210. In accordance with the present invention, transverse spin magnetization within distal portion 220 of blood vessel 210 is detected and spatially resolved data in a first dimension 230, a second dimension 240 and a third dimension 250 are acquired to form a magnetic resonance angiogram according to the present invention.

Figure 3:
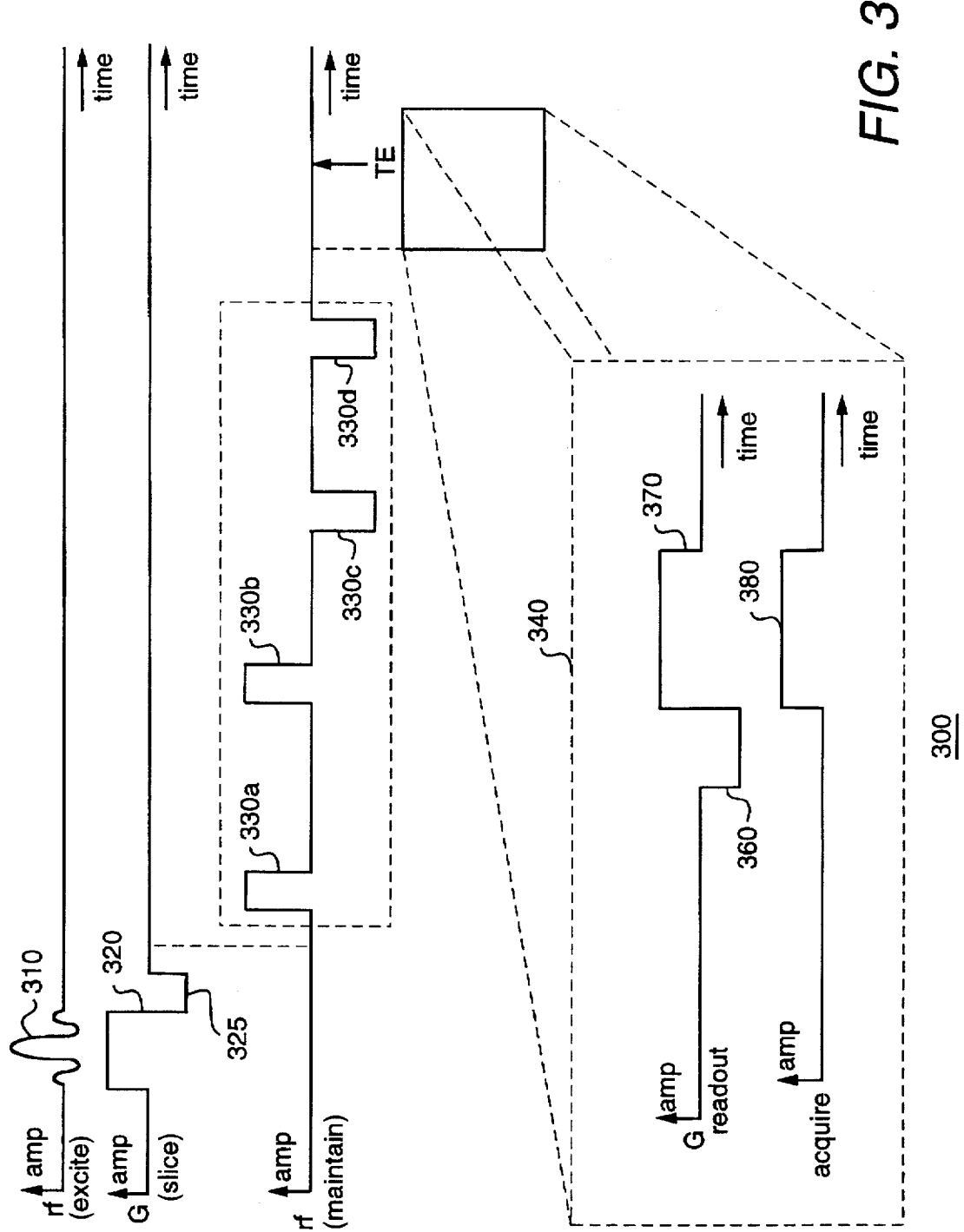
FIG. 3 is a pulse sequence diagram of a first embodiment of the present invention which can be used to detect moving blood within a subject.

FIG. 3 is a pulse sequence timing diagram of radio frequency (RF) pulses and magnetic field gradient pulses employed in a first embodiment of the present invention which may be executed by the MR imaging system. Pulse sequence 300 is comprised of an excitation RF pulse 310 applied in the presence of a simultaneously applied slice selective gradient pulse 320. Excitation pulse 310 nutates spin magnetization in a selected portion of the subject determined by the frequency of RF pulses 310 and the amplitude and direction of slice selective magnetic field gradient pulse 320. The degree of nutation can be selected by selecting the duration and amplitude of excitation pulse 310. The RF pulse may be selected to have a frequency, phase, bandwidth, and amplitude over time, and the slice selection gradient pulse may also be selected to have an amplitude over time to excite a selected portion of said subject having a non-planar geometry.

Slice selective magnetic field gradient pulse 320 is followed by a refocusing pulse 325 which has half the area of slice selective magnetic field gradient pulse 320. This causes the phase of transverse spin magnetization for all excited nuclear spins within the subject to be substantially the same at the end of final refocusing pulse 325.

After excitation RF pulse 310 and slice selective gradient pulse 320 are applied a refocusing pulse subsequence 330 is applied. Refocusing pulse subsequence 330 is comprised of a series of radiofrequency pulses which are designed to maintain phase coherence in the transverse magnetization. In the embodiment shown here, refocusing pulse subsequence 330 is comprised of a first refocusing pulse 330a, a second refocusing pulse 330b, a third refocusing pulse 330c and a fourth refocusing pulse 330d. Each of the refocusing pulses has a flip angle substantially equal to 180 degrees. In the current embodiment, third refocusing pulse 330c and fourth refocusing pulse 330d are given opposite polarity to that of first refocusing pulse 330a and second refocusing pulse 330b to compensate for inaccuracies in the RF pulses. Refocusing pulse subsequence 330 can be comprised of fewer or more RF pulses if desired. Refocusing RF pulse subsequence can also be applied simultaneously with a magnetic field gradient pulse of a selected shape, amplitude and duration to limit spin refocusing to a selected refocusing portion.

Alternative embodiments in which spin-locking RF pulses having much longer durations are also possible as described in "Nuclear Magnetic Resonance Spectroscopy, A Physicochemical View" pp. 91–93 by Robin K. Harris, published by Pittman Books, Ltd. Marshfield, Mass. (1983). Refocusing pulse subsequence 330 refocuses transverse spin magnetization over the portions of the subject which are within the excitation coil. Portions of the subject which are s subjected to refocusing pulse subsequence 330 but not to excitation pulse 310 will not have appreciable amounts of transverse spin magnetization. During refocusing pulse subsequence 330, blood within the blood vessels excited by RF excitation pulse 310 flows downstream and fills the distal portion of the blood vessels.

After refocusing pulse subsequence 330 is applied an imaging subsequence 340 is applied. Imaging subsequence 340 is comprised of a readout dephasing magnetic field gradient pulse 360 of a selected amplitude. Readout dephasing gradient pulse 360 is applied in first direction 230 as shown in FIG. 2 and can be orthogonal to slice selective gradient pulse 320 if desired. Readout dephasing pulse 360 causes transverse magnetization at different positions along the direction of the readout dephasing magnetic field gradient to obtain phase shifts which are proportional to position in the readout direction.

Following the application of readout dephasing pulse 360, a readout magnetic field gradient pulse 370 is applied. Readout magnetic field gradient pulse 370 is applied in the same direction as readout dephasing pulse 360, but is given the opposite polarity. The amplitude and duration of readout magnetic field gradient pulse 370 are selected so that substantially all transverse spin magnetization has an identical phase shift at a selected point during readout magnetic field gradient pulse 370.

Substantially simultaneously with the application of readout magnetic field gradient pulse 370, a data acquire signal pulse 380 is sent to a data acquisition subsystem which is part of the imaging system. MR response signals are digitized during data acquire pulse 380. Since the MR response signals coming from resonant nuclei within the selected portions of the subject are acquired during readout magnetic field gradient pulse 370, each detected MR response signal will have a frequency which is proportional to the location of the resonant nuclei which generated said signal. The location of each signal source can be determined by applying a Fourier transformation to the acquired signal data in a fashion well known to those skilled in the art.

In the present invention pulse sequence 300 is repeated a plurality, Y, times. In each of the Y repetitions, the offset of excitation pulse 310 is changed by adjusting its center frequency by a selected amount along second dimension 240 of FIG. 2. Upon completion of the Y repetitions, the Fourier transformed data from each of the Y repetitions is placed in an image matrix in which the displacement of each data vector acquired during each data acquire pulse 380 is made proportional to the displacement of the corresponding excitation pulse 310 to give a line-scan image in a fashion well known to those skilled in the art.

Figure 4:
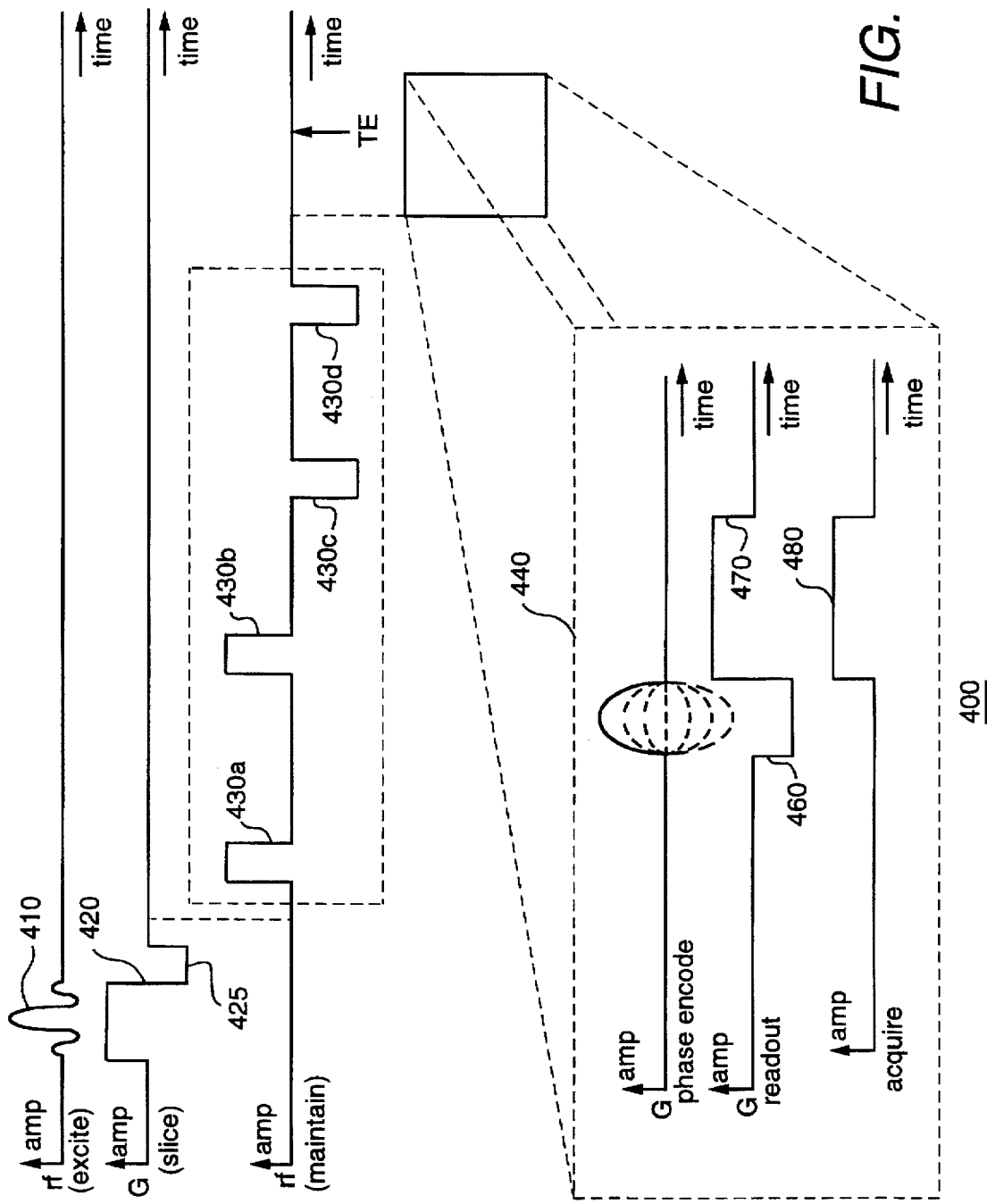
FIG. 4 is a pulse sequence diagram of a second embodiment of the present invention which can be used to detect moving blood within a subject.

FIG. 4 is a pulse sequence timing diagram of RF pulses and magnetic field gradient pulses employed in a second embodiment of the present invention which may be executed by the MR imaging system. Pulses 410, 420, 425, 430, 460, 470 and 480 are analogous to, and function as, pulses 310, 320, 325, 330, 360, and 370, and 380 respectively.

After refocusing pulse subsequence 430 is applied, an imaging subsequence 440 is applied. Imaging subsequence 440 is comprised of a phase-encoding magnetic field gradient pulse 450 of a selected amplitude. Phase-encoding gradient pulse 450 is applied in a selected direction which in this embodiment is second direction 240 shown in FIG. 2.

During the application of phase-encoding gradient pulse 450, a readout dephasing magnetic field gradient pulse 460 of a selected amplitude is applied. Readout dephasing gradient pulse 460 is applied in first direction 230 of FIG. 2 and can be orthogonal to slice selective gradient pulse 420 and phase-encoding gradient pulse 450 if desired.

In the present invention pulse sequence 400 is repeated a plurality, Y, times. In each of the Y repetitions; phase-encoding gradient pulse 450 is given a different amplitude. Phase-encoding gradient pulse 450 causes phase shifts in the detected MR signals which are proportional to the position of the resonant nuclei along the direction of phase-encoding magnetic field gradient pulse 450. Data acquired responsive to different amplitudes of phase-encoding gradient 450 can be Fourier transformed to give the position (in the direction of phase-encoding gradient pulse 450) of the resonant nuclei in a manner well known to those skilled in the art. This direction is commonly referred to as a "phase-encoding" direction.

Figure 5:
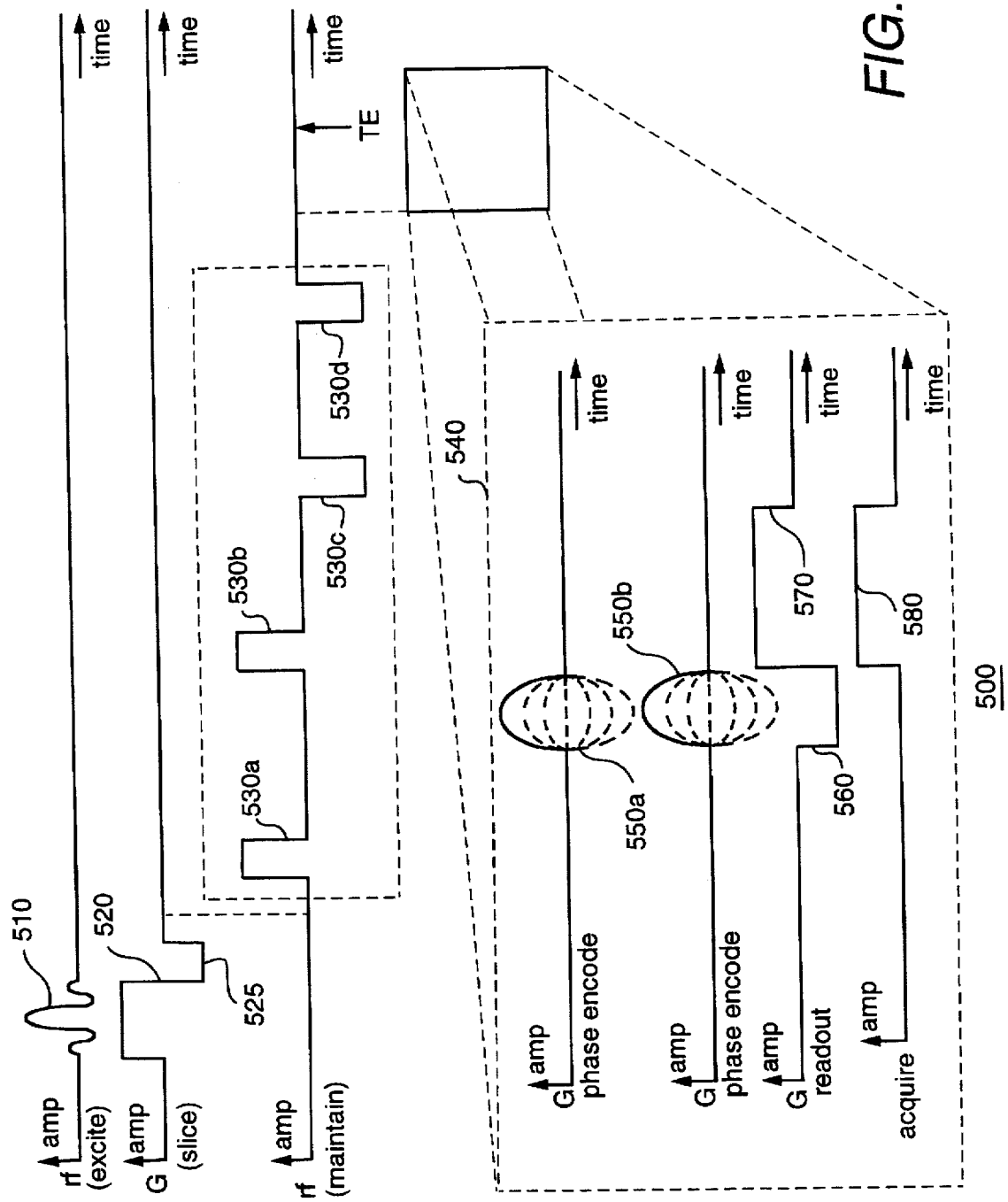
FIG. 5 is a pulse sequence diagram of a third embodiment of the present invention which can be used to detect moving blood within a subject.

FIG. 5 is a pulse sequence timing diagram of radio frequency (RF) pulses and magnetic field gradient pulses employed in a third embodiment of the present invention which may be executed by the MR imaging system. Similarly, pulses 510, 520, 525, 530, 550(a,b), 560, 570, 580 are analogous to and function as, pulses 410, 420, 425, 430, 450, 460, 470, and 480, respectively.

After refocusing pulse subsequence 530 is applied, an imaging subsequence 540 is applied. Imaging subsequence 540 is comprised of a first phase-encoding magnetic field gradient pulse 550a of a selected amplitude and a second phase-encoding magnetic field gradient pulse 550b. First phase-encoding gradient pulse 550a is applied in a first selected direction which in this embodiment is second direction 240 shown in FIG. 2. Second phase-encoding gradient pulse 550b is applied in a second selected direction which in this embodiment is third direction 250 shown in FIG. 2.

During the application of first phase-encoding gradient pulse 550a and second phase-encoding gradient pulse 550b, a readout dephasing magnetic field gradient pulse 560 of a selected amplitude is applied. Readout dephasing gradient pulse 560 is applied in first direction 230 of FIG. 2 and can be orthogonal to slice selective gradient pulse 520, first phase-encoding gradient pulse 550a and second phase-encoding gradient pulse 550b if desired.

In the present invention pulse sequence 500 is repeated a plurality, Y, times and each plurality of Y repetitions is repeated a plurality, Z times for a total number of repetitions equal to Y times Z. In each of the Y repetitions, first phase-encoding gradient pulse 550a is given a different amplitude. First phase-encoding gradient pulse 550a causes phase shifts in the detected MR signals which are proportional to the position of the resonant nuclei along the direction of first phase-encoding magnetic field gradient pulse 550a. Data acquired responsive to different amplitudes of first phase-encoding gradient 550a can be Fourier transformed to give the position (in the direction of first phase-encoding gradient pulse 550a) of the resonant nuclei in a manner well known to those skilled in the art. This direction is commonly referred to as a "phase-encoding" direction.

Likewise, in each of the Z repetitions, second phase-encoding gradient pulse 550b is given a different amplitude. Second phase-encoding gradient pulse 550b causes phase shifts in the detected MR signals which are proportional to the position of the resonant nuclei along the direction of second phase-encoding magnetic field gradient pulse 550b. Data acquired responsive to different amplitudes of second phase-encoding gradient 550b can be Fourier transformed to give the position (in the direction of second phase-encoding gradient pulse 550b) of the resonant nuclei in a manner well known to those skilled in the art. This direction is commonly referred to as the "second phase-encoding" direction.

Upon completion of Fourier transformation in the readout, first phase-encoding and second phase-encoding dimensions, a three-dimensional image of the transverse magnetization created by excitation RF pulse 510 is obtained.

Figure 6:
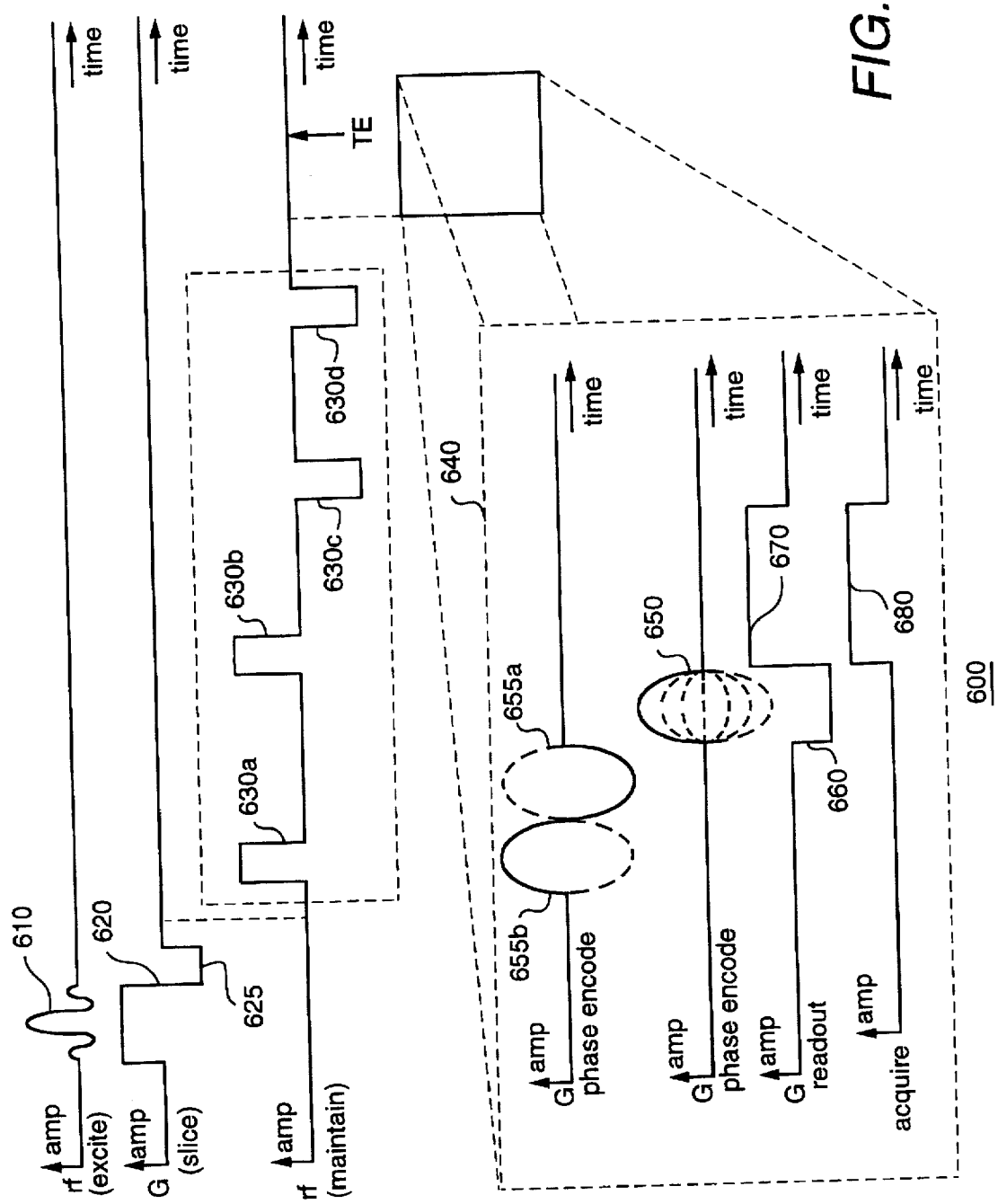
FIG. 6 is a pulse sequence diagram of a fourth embodiment of the present invention which can be used to detect moving blood within a subject.

FIG. 6 is a pulse sequence timing diagram of radio frequency (RF) pulses and magnetic field gradient pulses employed in a fourth embodiment of the present invention which may be executed by the MR imaging system. In FIG. 6 pulses 610, 620, 625, 630, 650, 660, 670, 680 are analogous to, and function as, pulses 510, 520, 525, 530, 550b, 560, 570 and 580, respectively.

After refocusing pulse subsequence 630 is applied, an imaging subsequence 640 is applied. Imaging subsequence 640 is comprised of a first flow-encoding magnetic field gradient pulse 655a of a selected polarity. First flow-encoding magnetic field gradient pulse has a non-zero first moment and induces phase-shifts in the transverse magnetization which are proportional to spin velocity along the direction of the flow-encoding gradient. First flow-encoding magnetic field gradient pulse is followed by a phase-encoding magnetic field gradient pulse 650 of a selected amplitude. Phase-encoding gradient pulse 650 is applied in a selected direction which in this embodiment is second direction 240 shown in FIG. 2.

In the present invention pulse sequence 600 is repeated a plurality, Y, times and each of the Y repetitions is repeated N times for a total number of repetitions equal to Y times N. In each of the Y repetitions, phase-encoding gradient pulse 650 is given a different amplitude. Phase-encoding gradient pulse 650 causes phase shifts in the detected MR signals which are proportional to the position of the resonant nuclei along the direction of phase-encoding magnetic field gradient pulse 650. Data acquired responsive to different amplitudes of phase-encoding gradient 660 can be Fourier transformed to give the position (in the direction of phase-encoding gradient pulse 650) of the resonant nuclei in a manner well known to those skilled in the art. This direction is commonly referred to as a "phase-encoding" direction.

In each of the N repetitions, the amplitudes of first flow-encoding magnetic field gradient pulse 655a is changed. In the embodiment shown in FIG. 6, N=2 and the amplitude of first flow-encoding magnetic field gradient pulse 655a is unchanged, but the polarity is reversed to give a second flow-encoding magnetic field gradient pulse 655b. The first and second flow-encoding pulses induce phase shifts in the transverse magnetization which are proportional to spin velocity and to the amplitude of the flow-encoding gradient. For spins which are substantially stationary, there is no induced phase shift. Consequently, data acquired responsive to each of the N applications can be mathematically combined to remove signal components arising from stationary spins while retaining signal components arising from moving spins. For the embodiment in which N=2, complex difference and phase difference calculations are useful. For embodiments in which N>2 other modulation schemes are well known to those skilled in the art of phase sensitive magnetic resonance angiography. It should be noted that the flow-encoding gradient waveforms used in the present embodiment encode for velocity and higher order terms of motion. More complicated waveforms which encode only selected higher orders of motion are also possible.

Several variants of the present invention are possible. For example, excitation and detection of data from M additional different sets of excitation volumes can be performed during periods in which longitudinal spin magnetization is allowed to recover in the first volume. This embodiment of the pulse sequence permits the detection of more images without increasing the total scan time.

Another possible variant is the use of a refocusing subsequence which is spatially selective to further limit the region of interest. The pulse sequences of the present invention can also be extended the acquisition of additional echoes to obtain multiple images, each with a unique echo time, TE. This could be accomplished by repeating the refocusing subsequence after the completion of data acquisition and applying a second readout gradient pulse concurrent with a second data acquire pulse. Additional echoes can be acquired in this fashion if desired.

Additional variations of multiple-echo embodiments of the present invention are possible. These include the incorporation of additional phase-encoding gradient pulses before each echo in a fashion similar to that used in conventional Fast Spin Echo techniques. This permits a shorter scan time since the Y phase-encoding steps needed to acquire data for image formation are acquired in Y/P applications of the pulse sequence, where P represents the number of echoes each occurring at a different time delay after the composite excitation RF pulse.

Each of the P repetitions may also include the application of an additional phase-encoding magnetic field gradient pulse to permit more rapid acquisition of the MR response signals needed to create the reconstructed MR image. Variations of the excitation geometry are also possible. For example, the planar excitation shown in the illustrated embodiments can be replaced by an excitation scheme which has a cylindrical, spherical or other non-planar geometry.

The imaging subsequences 440,540, 640 used to obtain magnetic resonance images with the second, third and fourth illustrated embodiments employ conventional spin-warp gradient waveforms. Other imaging subsequences such as projection reconstruction, echo-planar, spiral and hybrid imaging can also be employed if desired. Echo-planar and spiral imaging methods typically are high-speed imaging methods and particularly desirable because of their ability to make images in a short period of time.

Also, images acquired with the present invention can be combined to form a larger mosaic image. This permits a final image which has a larger field-of-view, while maintaining image contrast based upon in-flow of blood over a smaller distance.

While several presently preferred embodiments of the novel methods for the detection of transverse magnetization magnetic resonance angiograms have been described in detail herein, many modifications and variations will now become apparent to those skilled in the art. It is, therefore, to be understood that the appended claims are intended to cover all such modifications and variations as fall within the true spirit of the invention.

What is claimed is:

1. A method for the generation of magnetic resonance angiograms of a moving fluid within a subject, comprising the steps of:

a) placing said subject into a magnetic field to polarize nuclear spins;

b) applying to said subject an excitation radiofrequency (RF) pulse to nutate nuclear spins within said subject for the purpose of creating transverse spin magnetization;

c) applying to said subject an excitation magnetic field gradient pulse substantially simultaneously with the application of the excitation RF pulse to constrain the creation of transverse spin magnetization to a selected portion of an excitation region within said subject including said moving fluid;

d) applying to said subject after the application of the excitation RF pulse, a refocusing RF pulse subsequence to maintain coherence of the created transverse spin magnetization in said moving fluid as it moves from the excitation region to an acquisition region;

e) applying to said subject after the application of the excitation RF pulse, a readout dephasing magnetic field gradient pulse of a selected amplitude in a first selected direction to cause transverse spin magnetization to be dephased by an amount proportional to the location of the transverse magnetization in the first direction;

f) applying a readout magnetic field gradient pulse in the first selected direction with a polarity substantially opposite that of the readout dephasing magnetic field gradient pulse;

g) detecting with a receiver operating at a selected frequency, an MR response signal generated by the transverse spin magnetization of the acquisition region in the presence of the readout magnetic field gradient pulse;

h) repeating steps 'b'–'g' a plurality of Y repetitions; and i) creating a reconstructed MR image of a region different from the excitation region, from the acquired MR response signals.

2. The method of claim 1 where the reconstructed MR image is obtained by Fourier transforming the MR response signals, followed by organization of the transformed data into an image matrix with locations corresponding to the selected portions of said subject.

3. The method of claim 1 further comprising the step of applying to said subject after the application of the excitation RF pulse, a first phase-encoding magnetic field gradient pulse of a selected amplitude in a second selected direction to cause transverse spin magnetization to be dephased by an amount proportional to the location of the transverse magnetization in the second direction.

4. The method of claim 3 further comprising the step of applying to said subject after the application of the excitation RF pulse, a second phase-encoding magnetic field gradient pulse of a selected amplitude in a third selected direction to cause transverse spin magnetization to be dephased by an amount proportional to the location of the transverse magnetization in the third direction.

5. The method of claim 1 further comprising the step of applying to said subject after the application of the excitation RF pulse, a flow-encoding magnetic field gradient pulse of a selected amplitude in a selected flow-encoding direction to cause transverse spin magnetization to be dephased by an amount proportional to velocity of the transverse magnetization in the selected flow-encoding direction.

6. The method of claim 1 where steps 'b'–'h' are repeated M times to nutate and detect nuclear spins from M additional portions of said subject, to create M additional reconstructed MR images.

7. The method of claim 1 where the steps of applying the refocusing RF pulse subsequence is applied simultaneously with a magnetic field gradient pulse of a selected shape, amplitude and duration to limit spin refocusing to a selected refocusing portion of said subject being a region different from the excitation region.

8. The method of claim 1 where steps 'd'–'g' are repeated for P repetitions for each repetition of steps 'b' and 'c' to generate P MR response signals, each occurring at a different time delay after the excitation RF pulse.

9. The method of claim 8 where each of the P repetitions also includes the application of an additional phase-encoding magnetic field gradient pulse to permit more rapid acquisition of the MR response signals needed to create the reconstructed MR image.

10. The method of claim 1 wherein the excitation RF pulse has a frequency, phase, bandwidth, and amplitude over time and the slice selection gradient pulse has an amplitude over time to create an excitation region of said subject having a non-planar geometry.

11. A method for the generation of magnetic resonance angiograms of a moving fluid within a subject, comprising the steps of:

a) placing said subject into a magnetic field to polarize nuclear spins of said moving fluid;

b) applying to said subject an excitation radiofrequency (RF) pulse to nutate nuclear spins within said subject, creating transverse spin magnetization;

c) applying to said subject an excitation magnetic field gradient pulse substantially simultaneously with the application of the excitation RF pulse to constrain the creation of transverse spin magnetization to an excitation region within said subject including said moving fluid;

d) applying to said subject after the application of the excitation RF pulse, a refocusing RF pulse subsequence to maintain coherence of the created transverse spin magnetization as said moving fluid moves from an excitation region to an acquisition region;

e) applying to said subject after the application of the excitation RF pulse, a high-speed imaging subsequence to obtain MR response signals from the acquisition region; and f) creating a reconstructed MR image containing MR image data from the transverse spin magnetization created within the selected portion of said subject, and which has moved out of the selected portion.

12. The method of claim 11 where the high-speed imaging subsequence employs echo-planar magnetic field gradient waveforms.

13. The method of claim 11 where the high-speed imaging subsequence employs spiral magnetic field gradient waveforms.

* * * * *